(12) United States Patent
Bisbikis et al.

(10) Patent No.: US 7,929,300 B1
(45) Date of Patent: Apr. 19, 2011

(54) FILTER RETENTION IN ELECTRONICS CHASSIS

(75) Inventors: Steve Bisbikis, Hawthorn Woods, IL (US); Steve Koo, Chicago, IL (US); Todd Collis, Hoffman Estates, IL (US)

(73) Assignee: Flextronics AP, LLC, Broomfield, CO (US)

( * ) Notice: Subject to any disclaimer, the term of this patent is extended or adjusted under 35 U.S.C. 154(b) by 409 days.

(21) Appl. No.: 11/686,825

(22) Filed: Mar. 15, 2007

Related U.S. Application Data

(60) Provisional application No. 60/743,533, filed on Mar. 17, 2006.

(51) Int. Cl.
*H05K 7/20* (2006.01)
*H05K 5/00* (2006.01)
*A47B 77/08* (2006.01)
*B01D 46/00* (2006.01)

(52) U.S. Cl. .................... 361/695; 361/679.49; 454/184; 312/236; 312/223.2; 312/319.1; 312/334.46; 55/323; 55/327; 55/350.1; 55/478; 55/497

(58) Field of Classification Search ............ 361/679.48–679.49, 689–695; 454/184; 312/236, 223.2, 312/319.1, 334.46, 333; 55/323, 327, 350.1, 55/478, 497, 360, 383.6, 357, 511, 509
See application file for complete search history.

(56) References Cited

U.S. PATENT DOCUMENTS

| | | | |
|---|---|---|---|
| 6,007,169 A * | 12/1999 | Li et al. | 312/223.2 |
| 6,195,262 B1 * | 2/2001 | Bodette et al. | 361/752 |
| 6,538,881 B1 * | 3/2003 | Jeakins et al. | 361/679.46 |
| 7,312,990 B2 * | 12/2007 | Mangold | 361/695 |

* cited by examiner

*Primary Examiner* — Zachary M Pape
(74) *Attorney, Agent, or Firm* — James L. Johnson; Robert G. Crouch; Marsh Fischman & Breyfogle LLP

(57) ABSTRACT

An electronics assembly (48) is disclosed that utilizes a filter (24) within a plenum (50). The filter (24) may be electrically isolated from at least certain portions of the electronics assembly (48) by an electrical insulator (64). The electronics assembly (48) furthermore alleviates the need for a separate filter tray, and in this regard it may be such that only a first filter end (80) and a second filter end (82) of the filter (24) are supported within the electronics assembly (48).

22 Claims, 7 Drawing Sheets

FILTER RETENTION IN ELECTRONICS CHASSIS

CROSS-REFERENCE TO RELATED APPLICATIONS

This patent application claims priority under 35 U.S.C. §119(e) to pending U.S. Patent Provisional Patent Application Ser. No. 60/743,533, that is entitled "FILTER RETENTION IN ELECTRONICS CHASSIS," that was filed on Mar. 17, 2006, and the entire disclosure of which is hereby incorporated by reference in its entirety herein.

FIELD OF THE INVENTION

The present invention generally relates to the field of filters and, more particularly, to the manner of integrating a filter with an electronics assembly.

BACKGROUND OF THE INVENTION

Modern electronics, such as telecommunications equipment, is commonly contained in a housing or chassis that may or may not be mounted in a standard sized rack. The chassis may serve many functions, including providing structural support for the contents, providing a common electrical ground, providing protection from electromagnetic interference (EMI), and others.

Within certain industries, there are standards organizations that have promulgated specifications for certain types of electronics chassis. One example of such an organization is the PCI Industrial Computer Manufacturers Group (PICMG) and an example of such a specification is PICMG 3.0 Rev. 1.0 or as further updated, more commonly known as the Advanced Telecom Computing Architecture (ATCA) specification.

Along with voluminous other requirements, the ATCA specification specifies the mechanical configuration of a backplane within a housing, the number, size, and relative spacing of circuit boards (referred to as blades) that are retained within the housing and which electrically connect to the backplane. The ATCA specification also specifies the characteristics of the circuit ground provided for the blades, and the cooling and air filtering requirements for the housing.

The foregoing examples of the related art and limitations related therewith are intended to be illustrative and not exclusive. Other limitations of the related art will become apparent to those of skill in the art upon a reading of the specification and a study of the drawings.

SUMMARY OF THE INVENTION

A first aspect of the present invention is generally directed to an electronics assembly having a plenum, a filter, and an electrical insulator. The filter is disposed within the plenum and includes first and second filter ends. The electrical insulator is in contact with the first filter end.

A second aspect of the present invention is generally directed to an electronics assembly having a plenum, a filter, a backplane, and an electrical insulator. The filter is disposed within the plenum and includes first and second filter ends. The backplane includes a plurality of electrical contacts, and the first filter end is disposed at least substantially adjacent to the backplane (e.g., in closely spaced relation to the backplane; engaged with the backplane). The electrical insulator is disposed between the first filter end and the plurality of electrical contacts in a dimension in which the backplane extends (e.g., the electrical insulator is disposed at an intermediate elevation compared to the elevations of the first filter end and the plurality of electrical contacts).

A third aspect of the present invention is generally directed to an electronics assembly having a plenum and a filter. The filter is disposed within the plenum and includes first and second filter ends, along with first and second filter sides that each extend between the first and second filter ends. The first and second filter sides are unsupported in the case of the second aspect. The electronics assembly also includes at least one biasing member that biases the filter toward a first position.

A fourth aspect of the present invention is generally directed to a chassis having a plenum, a filter, and at least one biasing member. A first biasing member biases the filter toward a first position at least at some point in time. The chassis may be part of an electronics assembly in the case of the fourth aspect, but may be used in other applications as well.

Various refinements and/or additional features that may be utilized in relation to each of the above-noted aspects will now be addressed, and which may be used individually or in any combination. The various features addressed above in relation to each particular aspect also may be utilized in any of the other aspects, individually or in any combination.

The electronics assembly may be of any appropriate size, shape, configuration, and/or type, may include any appropriate number of components of any appropriate type, and any such multiple components may be disposed in any appropriate arrangement. In one embodiment, the electronics assembly is in the form of telecommunications equipment, that in turn includes one or more circuit boards or blades as they are commonly referred to in the telecommunications industry, and one or more printed circuit boards may be mounted on a common backplane. One or more fans may also be utilized to direct an airflow through the electronics assembly, including where an airflow is drawn through the filter before being allowed to flow past any of the printed circuit boards.

The plenum may be of any appropriate size and/or shape, and may be disposed at any appropriate location relative to the remainder of the electronics assembly. In one embodiment, the plenum provides an inlet for an airflow through at least a portion of the electronics assembly. This airflow may be a forced airflow (e.g., using one or more fans) or may be simply be in the form of a natural or non-driven airflow through at least a portion of the electronics assembly.

The filter may be of any appropriate size, shape, configuration, and/or type. The filter may provide any appropriate function or combination of functions, and may use one or more filtering materials that are appropriate for the relevant application (e.g., a particle filter). In one embodiment, the filter includes a metal or otherwise electrically conductive frame that extends about the entirety of its perimeter. An electrical insulator may be used to electrically isolate such a frame from at least part of the electronics assembly. For instance, such an electrical insulator may be disposed such that the first filter end engages the electrical insulator versus a backplane of the electronics assembly (e.g., the electrical insulator may interface with each of the first filter end and the backplane). The electrical insulator may also be disposed such that the electrical insulator is disposed between the first filter end and a plurality of electrical contacts. Consider the case where the electronics assembly includes a backplane that is vertically disposed. At least part of the electrical insulator may be disposed between the first filter end and the plurality of electrical contacts in the vertical dimension.

The filter may be disposed at any appropriate location within the electronics assembly, and furthermore may be disposed in any appropriate orientation relative to the remainder of the electronics assembly. In one embodiment, the filter is disposed in an inclined or angled orientation (e.g., angled relative to horizontal). The filter may also include one or more handles for facilitating installation and/or removal of the filter. Any such handle may be disposed at any appropriate location and may be of any appropriate configuration. However and in one embodiment, one or more handles are provided on a surface of the filter that projects or faces at least generally in a downward direction when the filter is installed in the electronics assembly.

The filter may include first and second filter sides that each extend between the first and second filter ends. These first and second filter sides are subject to a number of characterizations. One is that the first and second sides may be unsupported. Stated another way and for the case of the noted embodiment, only the first and second filter ends engage a corresponding structure of the electronics assembly. Another characterization is that the first and second filter sides may be free from contact with a remainder of the electronics assembly. In one embodiment, the electronics assembly lacks a filter tray for supporting the entire perimeter of the filter. In another embodiment, only a portion of a perimeter of the filter is supported when the filter is installed in the electronics assembly—for instance the supported portions of the filter may be the first and second filter ends.

The electronics assembly may include what is commonly referred to as a backplane, as well as a printed circuit board support. An electrical insulator may be in contact with the backplane. Further in this regard, the first end of the filter may engage the electrical insulator, the second end of the filter may engage a corresponding portion of the printed circuit board support, and the remainder of the filter may be unsupported. As noted above, one or more printed circuit boards may engage or at least be in electrical contact with the backplane, and furthermore may be supported by the printed circuit board support.

The electronics assembly may include a chassis, that in turn includes the above-noted backplane. An electrical insulator may be mounted to or otherwise engaged with this backplane in any appropriate manner, may be formed from any appropriate material or combination of materials (e.g., any resinous material), or both. This backplane may include a plurality of electrical contacts (e.g., pins). In one embodiment, the electrical insulator may be characterized as separating at least part of the filter from at least some of these electrical contacts. In another embodiment, the electrical insulator may be characterized as at least generally encasing the first filter end. In yet another embodiment, the electrical insulator may be characterized as including first and second cavities that are isolated from each other, where the first filter end is disposed within the first cavity, and where at least some of the plurality of electrical contacts are disposed in the second cavity. The noted second cavity may be disposed at a higher elevation than the first cavity, the first and second cavities may project or open in opposite directions, or both.

At least one biasing member may be utilized in relation to the filter. Any appropriate number of biasing members may be utilized, and any use of multiple biasing members may have the various individual biasing members disposed in any appropriate arrangement relative to the filter. Each biasing member may be of any appropriate size, shape, configuration, and/or type. Generally, at least one biasing member may be utilized to at least at some time bias the filter in a certain direction (e.g., during installation of the filter). In one embodiment, one or more biasing members are used to facilitate the retention of the filter in a certain position relative to the remainder of the electronics assembly. For instance, at least one biasing member may be compressed when disposing the filter in a first position relative to the remainder of the electronics assembly (e.g., so that the filter "clears" a catch or the like), the filter may thereafter be moved from the first position to a second position (e.g., so that one filter end is now aligned within a space defined at least in part by the noted catch), and the biasing member(s) may then be allowed to expand (e.g., so that a filter end is now disposed within the space defined at least in part by the noted catch). One or more biasing members could also be used to maintain the filter in compression between its first and second filter ends in the installed position as well (e.g., one or more biasing members may still be at least slightly compressed when the filter is in its installed position).

One or more biasing members may be mounted on the filter and may engage another portion of the electronics assembly at least at some point in time when the filter is being installed in the electronics assembly, one or more biasing members may be mounted on a portion of the electronics assembly so as to be engageable with the filter at least at some point in time when the filter is being installed in the electronics assembly, or both. In one embodiment, one or more biasing members are mounted on or toward the first end of the filter. Any such biasing members may be compressed to allow the second filter end to be disposed within a cavity defined by the above-noted printed circuit board support, may bias the second filter end into engagement with the printed circuit board support when the biasing member(s) subsequently expands, or both. It should be appreciated that one or more biasing members could be mounted on a structure of the electronics that positionally opposes the first filter end to provide the above-noted functionality.

BRIEF DESCRIPTION OF THE DRAWINGS

Exemplary embodiments are illustrated in referenced figures of the drawings. It is intended that the embodiments and figures disclosed herein be considered illustrative rather than limiting.

DETAILED DESCRIPTION

Reference will now be made to the accompanying drawings, which assist in illustrating the various pertinent features of the present invention. Although the present invention will now be described primarily in conjunction with an electronics chassis, it should be expressly understood that the present invention may be applicable to other applications where it is desired to achieve an improved technique for retention of a filter or other device. In this regard, the following description of an electronics chassis is presented for purposes of illustration and description. Furthermore, the description is not intended to limit the invention to the form disclosed herein. Consequently, variations and modifications commensurate with the following teachings, and skill and knowledge of the relevant art, are within the scope of the present invention. The embodiments described herein are further intended to explain modes known of practicing the invention and to enable others skilled in the art to utilize the invention in such, or other embodiments and with various modifications required by the particular application(s) or use(s) of the present invention.

Figure 1:
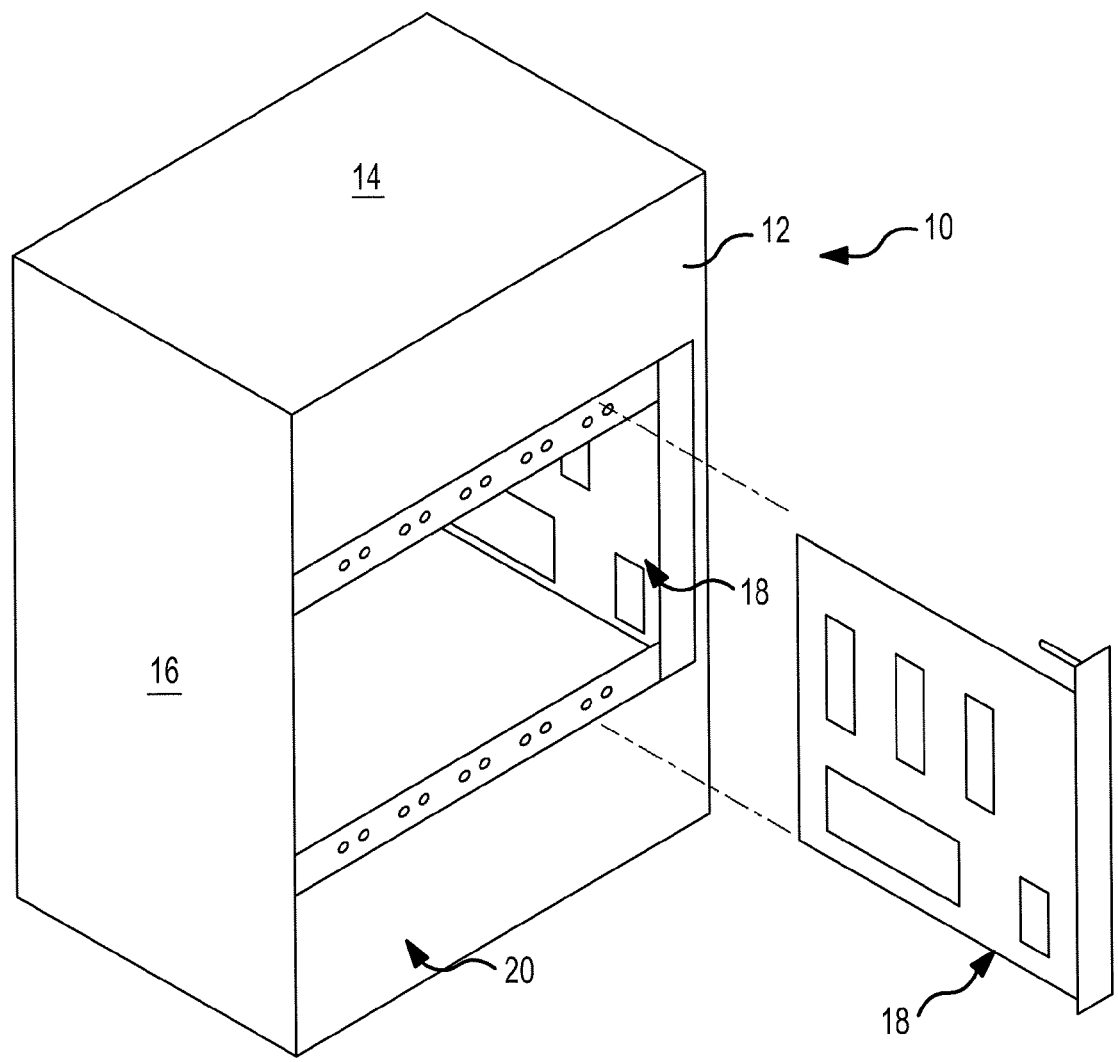
FIG. 1 is a perspective view of an electronics assembly that includes a chassis, along with a circuit card that is insertable into the chassis.

The electronics assembly shown in FIG. 1 includes an ATCA chassis 10, that in turn includes a housing having a front wall 12, a back wall, a top wall 14, and a pair of lateral side walls 16. Contained within the housing are a plurality of telecommunication circuit cards, also known as blades 18. Also contained within the housing may be circuitry for power interface and distribution, for control of fans, and for management of all of the other circuitry within the housing. As can be seen, one blade 18 is shown inserted into the chassis 10 and one is not currently inserted.

Figure 2:
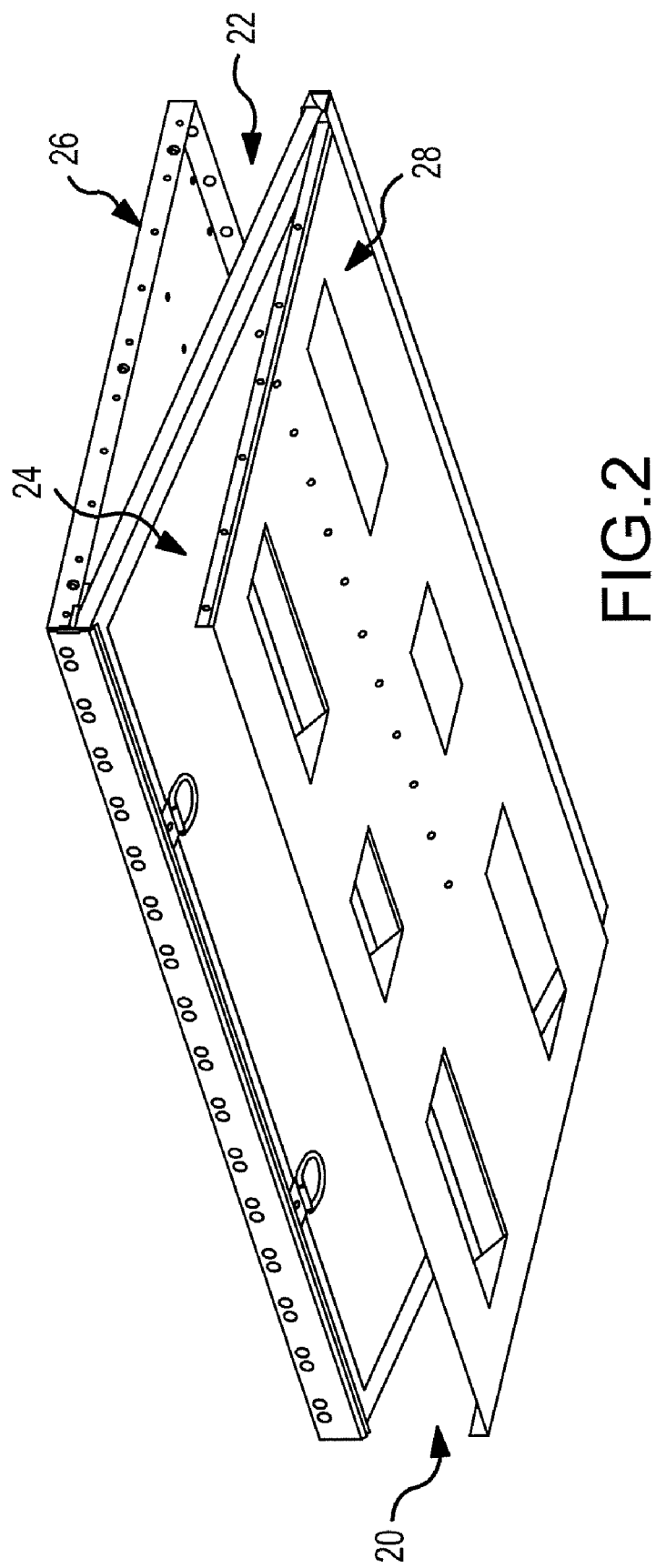
FIG. 2 is a perspective view of portions of the internal structure of the chassis of FIG. 1 and an air filter retained therein.

On the bottom end of the front face of the chassis 10 is an opening 20 into an inlet plenum 22 that contains an air filter 24 as shown in FIG. 2. The air filter 24 is retained between an upper frame member 26 and a lower frame member 28.

Figure 4:
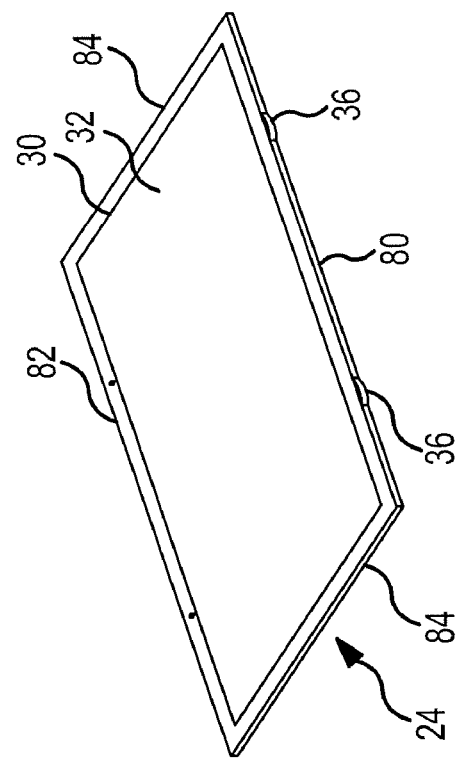
FIG. 4 is a perspective view of an opposite end of the air filter of FIG. 2.
Figure 3:
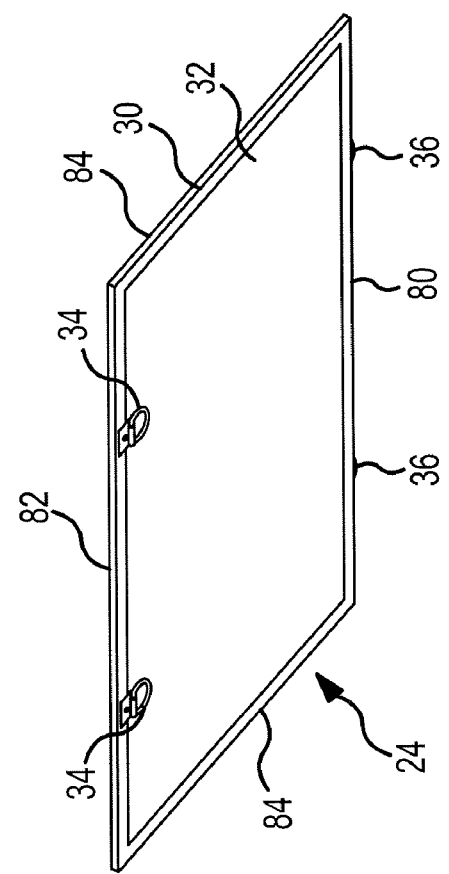
FIG. 3 is a maybe perspective view of the air filter of FIG. 3.

As can be seen in FIGS. 3 and 4, the air filter 24 includes a frame or enclosure 30 extending around the perimeter or periphery thereof. The enclosure 30 retains filter material 32 therein. As seen in FIG. 3, a pair of handles 34 are attached along a front portion of the enclosure 30. As can be seen in FIG. 4, a pair of biasing members in the form of compression spring-clips 36 are attached along a rear portion of the enclosure 30. The spring-clips 36 may be composed of spring steel, or any other suitable material. The spring-clips 36 are held in a bowed position that they will attempt to resiliently return to after any compressive force is removed.

Any appropriate biasing member may be used in place of any compression spring-clip 36. Any appropriate number of such biasing members could be utilized as well. Although the biasing members (spring-clips 36) are illustrated as being mounted on the filter 24, it should be appreciated that one or more biasing members could also be mounted/positioned on a structure (e.g., flange 42) that positionally opposes the end of the filter 24 on which the spring-clips 36 are mounted in the illustrated embodiment.

Figure 6:
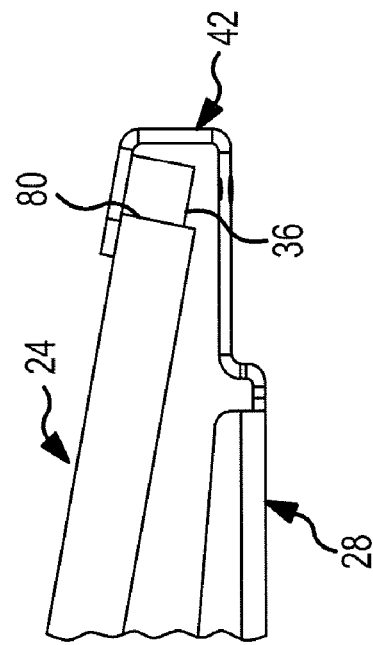
FIG. 6 is a side view of a different portion of the internal structure of the chassis and air filter of FIG. 2.
Figure 5:
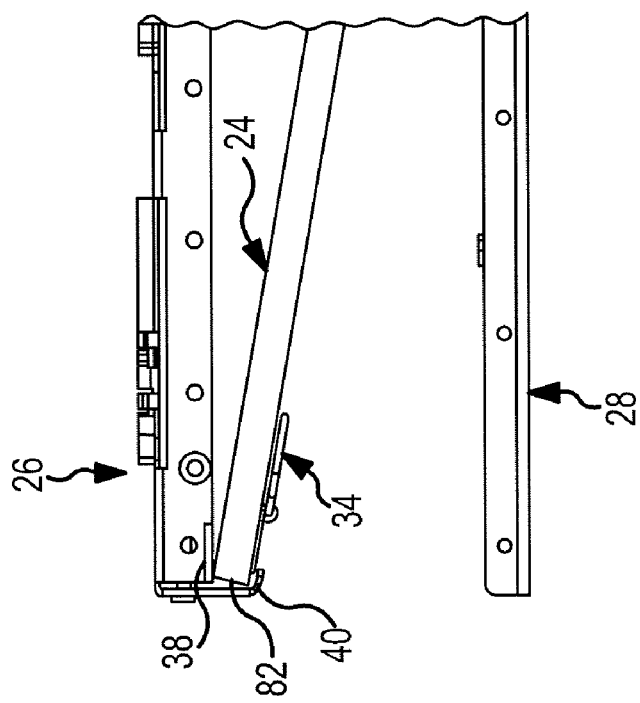
FIG. 5 is a side view of a portion of the internal structure of the chassis and air filter of FIG. 2.

As shown in FIG. 5, the upper frame member 26 includes an upper flange 38 and a lower flange 40 that the air filter 24 is retained between. As shown in FIG. 6, the lower frame member 28 includes a u-shaped flange 42 that is formed to retain the air filter 24 therein. In one embodiment, the u-shaped flange 42 is in the form of an electrical insulator (e.g., formed from a resinous material).

The air filter 24 is sized such that, with the spring-clips 36 in the bowed position, the air filter 24 is retained between the respective flanges of the upper and lower frame members 26 and 28. When it is desired to remove the air filter 24 from the chassis 10, the handles 34 can be actuated by a human to force the air filter 24 toward the u-shaped flange 42 on the lower frame member 28 and to thus compress the spring-clips 36. In this position, the upper portion of the air filter 24 can be removed from between the upper and lower flanges 38 and 40 of the upper frame member 26. In this manner, the air filter 24 can be removed from the chassis 10. The spring-clips 36 will then return to the bowed position, due to the resilient nature of the spring-clips 36. The air filter 24 (or a replacement filter) can be inserted back into the chassis 10 in an opposite manner.

Figure 7:
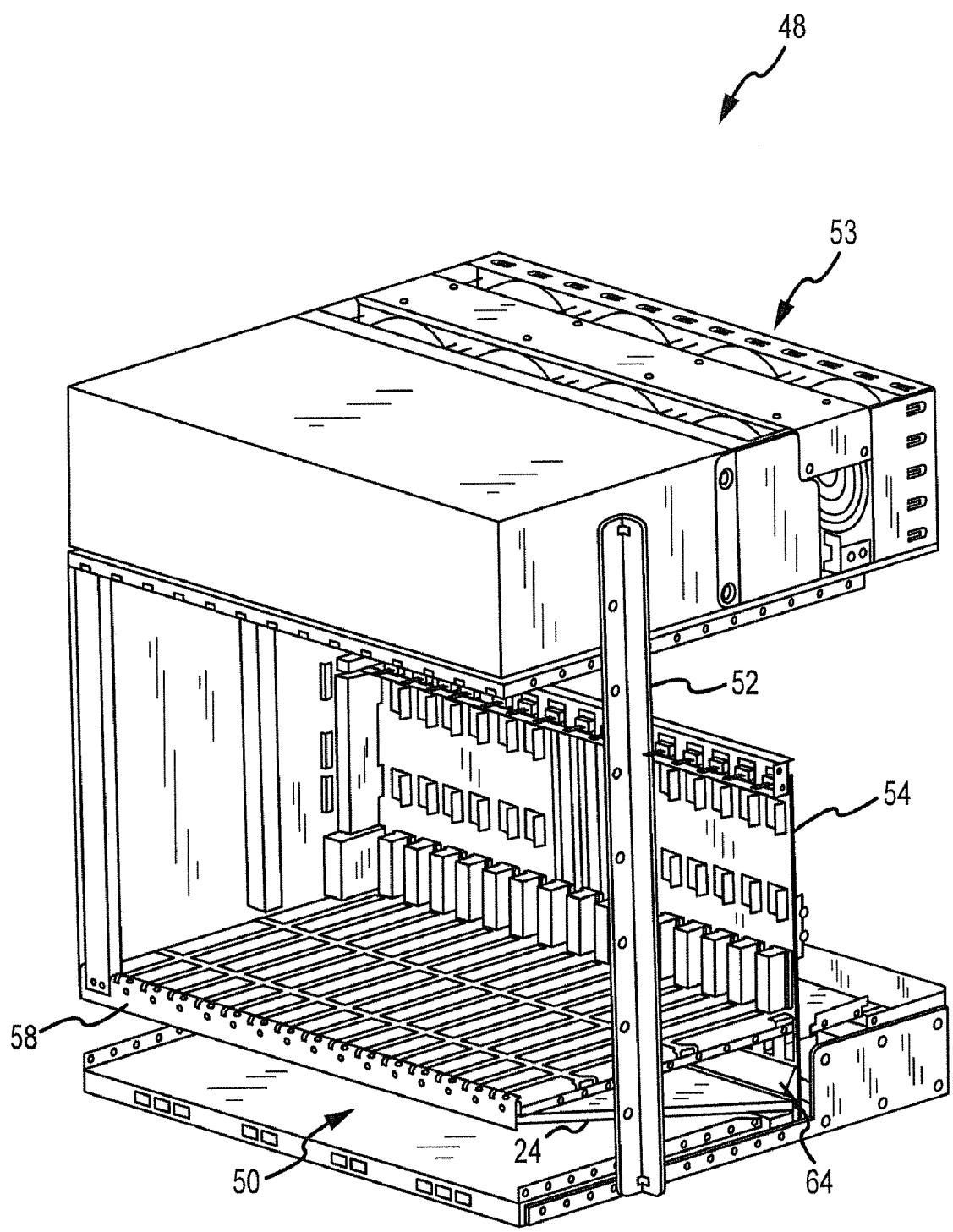
FIG. 7 is another embodiment of an electronics assembly that includes a filter and of electrical insulator that is associated with this filter.
Figure 8:
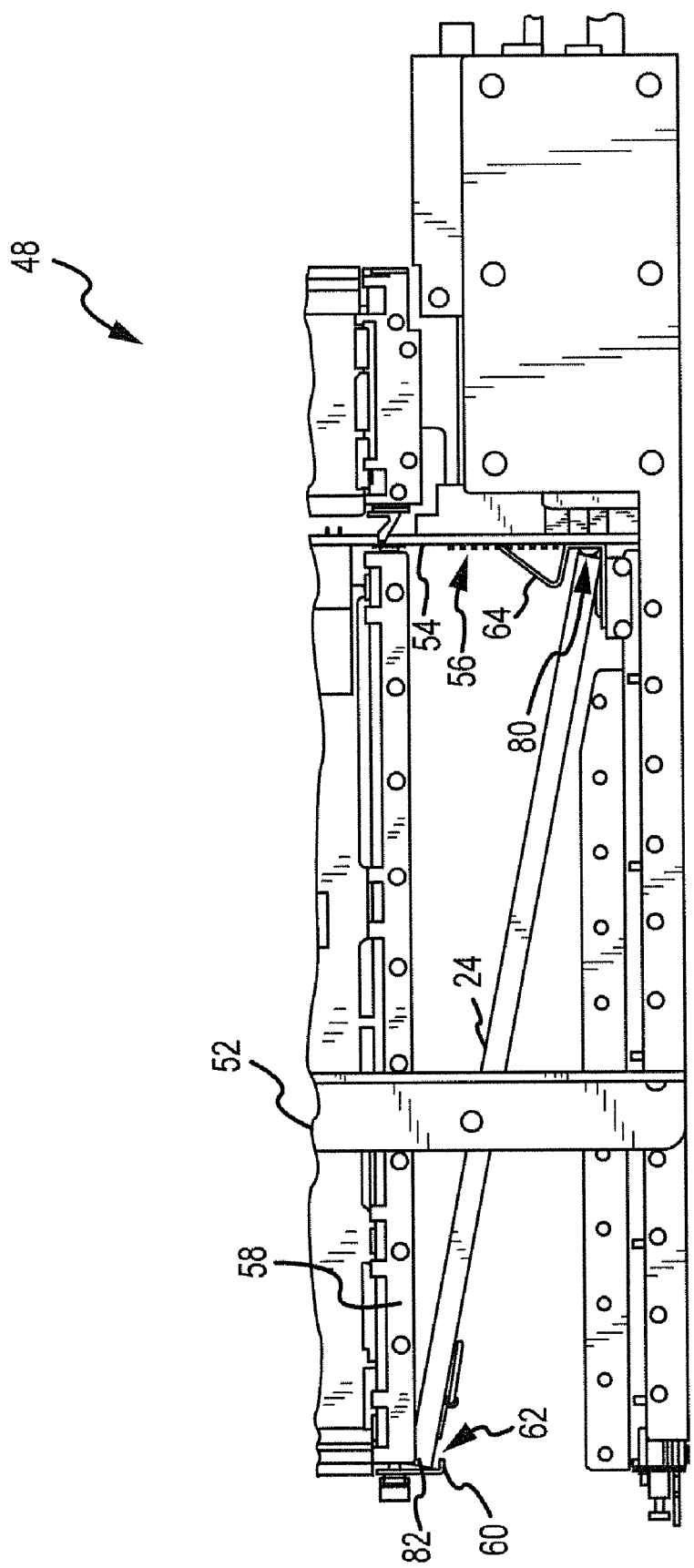
FIG. 8 is a side view of a lower portion of the electronics assembly of FIG. 7.

Another embodiment of an electronics assembly is illustrated in FIGS. 7-8 and is identified by reference numeral 48. The electronics assembly 48 may be of any appropriate size, shape, configuration, and/or type, may provide any appropriate function or combination of functions, and may include any appropriate type/number of components and that are disposed in any appropriate arrangement. Generally, the electronics assembly 48 includes a supporting framework or chassis 52 that may be of any appropriate size, shape, and configuration, and that includes what may be characterized as a printed circuit board support 58 and a backplane 54 (e.g., a circuit board used as a backbone to connect several printed circuit boards 18). One or more printed circuit boards or blades 18 (FIG. 1) may be appropriately mounted on the printed circuit board support 58 and interface/electrically interconnect with the backplane 54. One end of the printed circuit board support 58 includes a lip 60 that defines a cavity 62 for purposes that will be addressed below.

What may be characterized as a plenum 50 (e.g., an inlet plenum) is disposed below the printed circuit board support 58. A filter 24 in accordance with the foregoing is disposed within the plenum 50, and one end of which is disposed within the cavity 62 associated with the underside of the printed circuit board support 58. An airflow of any appropriate type may be directed into the plenum 50 and through the filter 24 to cool the various printed circuit boards 18 that are mounted on the printed circuit board support 58 and that interface with the backplane 54. One or more fans of an airflow assembly 53 could be used to provide this airflow (e.g., utilizing a suction action to draw an airflow through the electronics assembly 48 in the case of the illustrated embodiment), or any airflow could simply be of a naturally occurring or non-driven nature.

The electronics assembly 48 also includes what may be characterized as a backplane 54 as previously noted. A plurality of electrical contacts 56 (e.g., pins) extend through or are otherwise mounted to the backplane 54. Any number of electrical contacts 56 may be associated with the backplane 54, the electrical contacts 56 may be of any appropriate size, shape, configuration, and/or type, and these electrical contacts 56 may be disposed in any appropriate arrangement. Since the filter 24 is disposed in proximity to at least some of these electrical contacts 56, the electronics assembly 48 further includes an electrical insulator 64. This electrical insulator 64 may be formed from any appropriate material or combination of materials (e.g., one or more resins, or a resinous material) and may be mounted to and/or interface with the backplane 54, another portion of the chassis 52, or both and in any appropriate manner.

Figure 9:
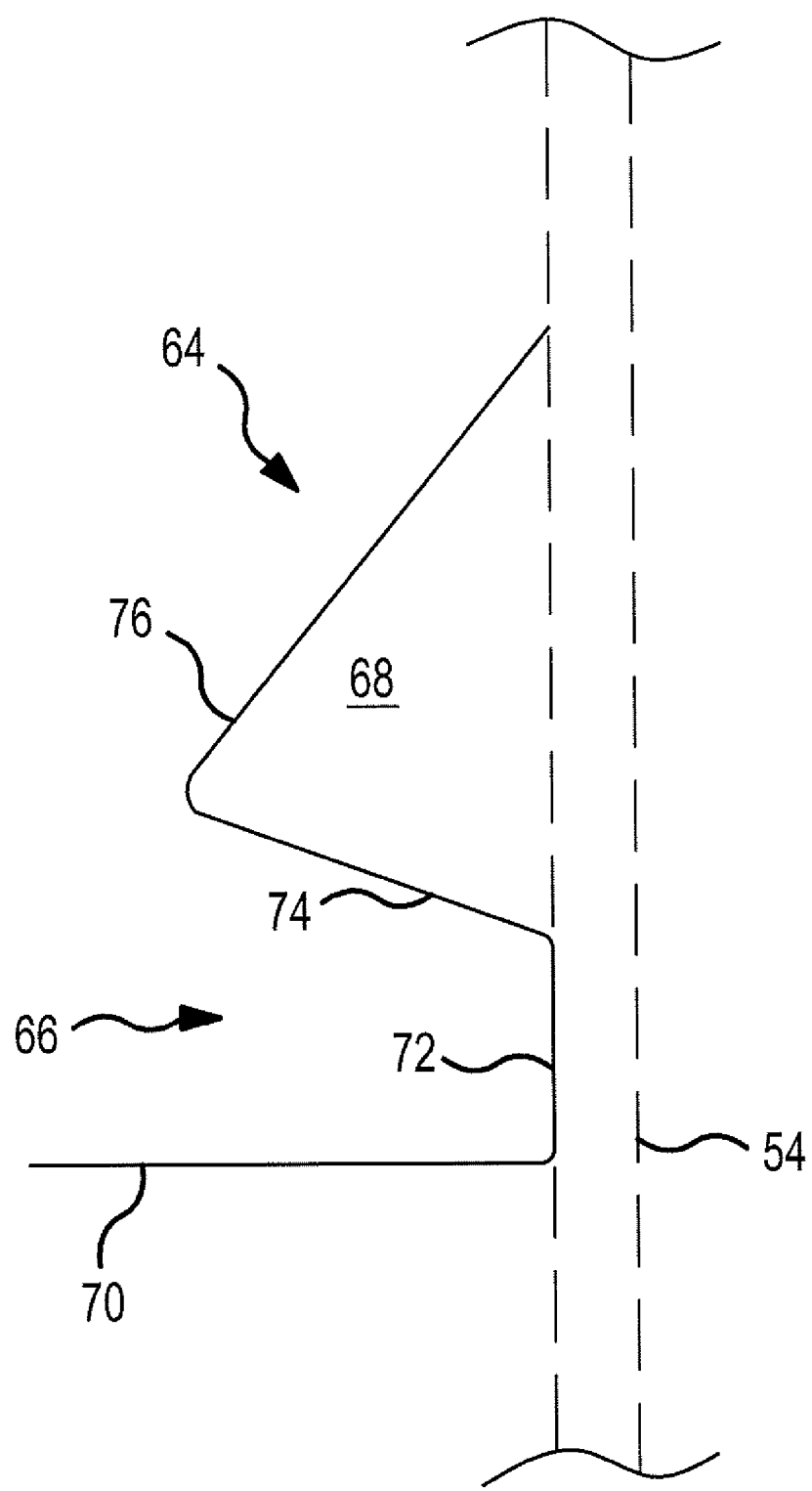
FIG. 9 is an enlarged end view of the electrical insulator for the electronics assembly of FIG. 7.

An enlarged view of the electrical insulator 64 is presented in FIG. 9, and includes a first insulator section 70, a second insulator section 72, a third insulator section 74, and a fourth insulator section 76. The first insulator section 70, second insulator section 72, and third insulator section 74 collectively define a first cavity 66 for receiving a first filter end 80 of the filter 24 (e.g., the "lower" end of the filter 24 in the installed position for the illustrated embodiment), while the third insulator section 74 and fourth insulator section 76 collectively define a second cavity 68 that is isolated from the first cavity 66, and that contains at least some of the electrical contacts 56 that are associated with the backplane 54 of the electronics assembly 48. Generally, the second cavity 68 is disposed at a higher elevation than the first cavity 66, and the cavity is 66, 68 open or project in opposite directions.

In the illustrated embodiment, the third insulator section 74 is disposed between the first filter end 80 and the adjacent-most electrical contacts 56 in the vertical dimension. It may be such that the first insulator section 70 and second insulator section 72 are not required for certain configurations of the backplane 54, and in this case these sections 70, 72 of the electrical insulator 64 may be eliminated (not shown). That is, the third insulator section 74, alone or in combination with the fourth insulator section 76, may provide a sufficient electrical isolation between the filter 24 and electrically conductive portions of the backplane 54. In this case, the first filter end 80 and/or the spring-clips 36 would directly engage the backplane 54.

The electronics assembly 48 of FIGS. 7-8 only supports the first filter end 80 and the second filter end 82, as in the case of the embodiment of FIGS. 1-6. That is, the pair of opposing filter sides 84 of the filter 24 are unsupported or are not contacted by any other portion of the electronics assembly 48. Stated another way, the electronics assembly 48 supports the filter 24 in a manner that alleviates the need for a separate filter tray or the like. Stated yet another way, the electronics assembly 48 supports less than the entire perimeter of the filter 24.

The installation of a filter 24 in the electronics assembly 48 of FIGS. 7-8 will now be summarized—the protocol would of course be reversed to remove the filter 24. The first filter end 80 is directed into the first cavity 66 of the electrical insulator 64 and with the filter 24 being in at least generally in a first position or orientation. The filter 24 may be oriented at this time such that its handles 34 project or face in an at least generally downward direction, and further in accordance with the embodiment of FIGS. 1-6 (e.g., see FIG. 5). The spring-clips 36 associated with the first filter end 80 may then be moved into engagement with the second insulator section 72 of the electrical insulator 64 at least generally by an axial movement of the filter 24 (e.g., by an individual grasping the handles 36 of the filter 24 and manually moving the same), and are thereafter compressed by a continued movement of the filter 24 toward the second insulator section 72. Once the filter 24 has advanced a sufficient distance, the second filter end 82 will clear the lip 60 of the printed circuit board support 58. As such, the filter 24 may be moved into a new position or orientation to align the second filter end 82 with the cavity 62 defined by the lip 60 on the underside of the printed circuit board support 58 (e.g., by a pivotal or pivotal-like movement of the filter 24 about its first filter end 80). The compressive force being exerted on the spring-clips 36 may be reduced (e.g., by an operator reducing the amount of force being manually exerted on the filter 24, such as by grasping the handles 34) such that the subsequent expansion of the spring-clips 36 will then direct the second filter end 82 into the cavity 62 a certain distance such that the lip 60 is disposed vertically below an aligned a portion of the filter 24. Although not required, the spring-clips 36 may remain partially compressed when the second filter end 82 is engaging the printed circuit board support 58 at the end of the cavity 62. In this case, the filter 24 would be under compression between its first filter end 80 and its second filter end 82, and which may be of further benefit in relation to maintaining the position of the filter 24.

Any other combination of all the techniques discussed herein is also possible. The foregoing description has been presented for purposes of illustration and description. Furthermore, the description is not intended to limit the invention to the form disclosed herein. While a number of exemplary aspects and embodiments have been discussed above, those of skill in the art will recognize certain variations, modifications, permutations, additions, and sub-combinations thereof. It is therefore intended that the following appended claims and claims hereafter introduced are interpreted to include all such variations, modifications, permutations, additions, and sub-combinations as are within their true spirit and scope.

What is claimed is:

1. An electronics assembly, comprising:
   a plenum;
   a filter disposed within said plenum and comprising first and second filter ends;
   a backplane comprising a plurality of electrical contacts, wherein said first filter end is disposed at least substantially adjacent to said backplane; and
   an electrical insulator comprising first and second cavities that project in opposite directions, wherein said first filter end is disposed within said first cavity, and wherein at least some of said plurality of electrical contacts of said backplane are disposed in said second cavity.

2. The electronics assembly of claim 1, wherein a perimeter of said filter comprises a metal frame, and wherein a portion of said metal frame is in contact with said electrical insulator.

3. The electronics assembly of claim 1, wherein said filter further comprises first and second filter sides that each extend between said first and second filter ends, wherein said first and second filter sides are free from contact with the remainder of said electronics assembly.

4. The electronics assembly of claim 1, wherein said electronics assembly further comprises a printed circuit board support, wherein said electrical insulator is disposed between said backplane and said first filter end, and wherein said second filter end engages a portion of said printed circuit board support that is spaced from said backplane.

5. The electronics assembly of claim 1, wherein said second cavity is disposed at a higher elevation than said first cavity.

6. The electronics assembly of claim 1, further comprising:
   at least one biasing member that in turn comprises a first biasing member, wherein said first biasing member biases said filter toward a first position at least during an installation of said filter.

7. The electronics assembly of claim 6, wherein said first biasing member is mounted on said filter.

8. The electronics assembly of claim 6, wherein said first biasing member is mounted on one of said first and second filter ends of said filter.

9. The electronics assembly of claim 1, further comprising at least one printed circuit board, wherein air flowing through said plenum and through said filter flows past said printed circuit board.

10. An electronics assembly, comprising:
    a plenum;
    a filter disposed within said plenum and comprising first and second filter ends;
    an electrical insulator in contact with said first filter end, wherein said electrical insulator comprises first and second cavities that are isolated from each other, and wherein said first filter end is disposed within said first cavity of said electrical insulator; and
    a chassis that in turn comprises a backplane, wherein said electrical insulator interfaces with said backplane, wherein said backplane comprises a plurality of electrical contacts, and wherein at least some of said plurality of electrical contacts are disposed in said second cavity of said electrical insulator.

11. The electronics assembly of claim 10, wherein said plenum is associated with an air inlet of said electronics assembly.

12. The electronics assembly of claim 10, wherein a perimeter of said filter comprises a metal frame, and wherein a portion of said metal frame is in contact with said electrical insulator.

13. The electronics assembly of claim 10, wherein said filter further comprises first and second filter sides that each extend between said first and second filter ends, wherein said first and second filter sides are unsupported.

14. The electronics assembly of claim 10, wherein said filter further comprises first and second filter sides that each extend between said first and second filter ends, wherein said first and second filter sides are free from contact with the remainder of said electronics assembly.

15. The electronics assembly of claim 10, wherein said filter further comprises at least one handle that projects in an at least generally downward direction.

16. The electronics assembly of claim 10, wherein said electronics assembly further comprises a printed circuit board support, wherein said electrical insulator is disposed between said backplane and said first filter end, and wherein said second filter end engages a portion of said printed circuit board support that is spaced from said backplane.

17. The electronics assembly of claim 10, wherein said electrical insulator comprises a resinous material.

18. The electronics assembly of claim 10, wherein said second cavity is disposed at a higher elevation than said first cavity.

19. The electronics assembly of claim 10, further comprising:
   at least one biasing member that in turn comprises a first biasing member, wherein said first biasing member biases said filter toward a first position at least during an installation of said filter.

20. The electronics assembly of claim 19, wherein said first biasing member is mounted on said filter.

21. The electronics assembly of claim 19, wherein said first biasing member is mounted on one of said first and second filter ends of said filter.

22. The electronics assembly of claim 10, further comprising at least one printed circuit board, wherein air flowing through said plenum and through said filter flows past said printed circuit board.

* * * * *